United States Patent [19]

Glaser et al.

[11] Patent Number: 5,063,419
[45] Date of Patent: Nov. 5, 1991

[54] HETEROSTRUCTURE DEVICE USEABLE AS A FAR INFRARED PHOTODETECTOR

[75] Inventors: Evan R. Glaser; Benjamin V. Shanabrook, both of Alexandria, Va.

[73] Assignee: The United States of America as represented by the Secretary of the Navy, Washington, D.C.

[21] Appl. No.: 271,546

[22] Filed: Nov. 15, 1988

[51] Int. Cl.$^5$ .................. H01L 29/161; H01L 29/205; H01L 29/225; H01L 27/12
[52] U.S. Cl. .......................................... 357/16; 357/4; 357/17; 357/30
[58] Field of Search ..................... 357/16, 45 L, 4, 30, 357/17

[56] References Cited

U.S. PATENT DOCUMENTS 4,000,095 7/1986 Shanabrook ........................... 357/30
4,806,993 2/1989 Voisin et al. ............................ 357/4

OTHER PUBLICATIONS

E. Glaser et al., "Far Infrared Magneto-Absorption Study of Barrier Impurities and Screening in GaAs/AlGaAs Multiple Quantum Wells", Journal de Physique, vol. 48, No. 11, dated 11/87.
E. Glaser, "Far-Infrared Magneto Absorption . . . ", Phy. Rev. B., vol. 36 (No. 15) p. 8185, 11/15/87.
S. M. Sze, Physics of Semiconductor Devices, John Wiley & Sons, 2nd ed., 1981, pp. 22-23.
Ashcroft et al., Solid State Physics, pp. 577-580.
Semiconductors and Semimetals, vol. 24 of Applications of Multiquantum Wells, Selective Doping, and Superlattices (R. Dingle, ed., Academic Press, Inc., 1987).
E. E. Anderson, Modern Physics and Quantum Mechanics (W. B. Saunders Co.), pp. 272-287.
B. V. Shanabrook, The Properties of Hydrogenic Donors Confined in GaAs-AlGaAs Multiple Quantum Wells, Surface Science, vol. 170, pp. 449-458 (1986).
C. J. Armistead et al., Spectroscopic Observation of D-, D$^0$ and Cyclotron Resonance Lines in n-GaAs and n-InP at Intermediate and Strong Magnetic Fields and Under Different Conditions of Bias, Temperature and Pressure, Solid State Communications, vol. 53, pp. 1109-1114 (1985).
P. Lane et al., Shallow Donors in Multiple-Well GaAs-Ga$_{1-x}$Al$_x$As Heterostructures, Phys. Rev.B, vol. 33, p. 5871 (1986).
R. L. Greene et al., Far-Infrared Absorption by Shallow Donors in Multiple-Well GaAs-Ga$_{1-x}$Al$_x$As Heterostructures, Phys. Rev. B, vol. 34, p. 8639, (1986).
Ronald L. Greene, Effect of Magnetic Field on the Energy Levels of a Hydrogenic Impurity Center in GaAs/Ga$_{1-x}$Al$_x$As Quantum-Well Structures, Physical Review B, vol. 31, No. 2, pp. 913-918, Jan. 15, 1985.
R. L. Greene and K. K. Bajaj, Far-Infrared Absorption Profiles for Shallow Donors in GaAs-Al$_x$Ga$_{1-x}$As Quantum-Well Structures, Physical Rev. B, 1986, The American Physical Society, vol. 34, No. 2, pp. 951-955.

Primary Examiner—Andrew J. James
Assistant Examiner—Daniel Kim
Attorney, Agent, or Firm—Thomas E. McDonnell; Edward F. Miles

[57] ABSTRACT

A semiconductor heterostructure useful as a photodetector in the far infrared. The barrier layers of the heterostructure are doped so that charge carriers migrate from the energy bands of the barrier layers towards the energy bands of the quantum wells, but remain weakly bound to the doping impurities in the barrier layers. Because of weak residual bonding, the energy necessary to raise these electrons fully into the quantum wells' energy band is significantly reduced, extending the lower frequency range at which such devices are useful as photodetectors. Selection of several of the heterostructure's dimensions determine the impurities' resonant absorption frequency, and application of an electric or magnetic field shifts the well's resonant absorption frequency, in effect frequency fine tuning the heterostructure.

10 Claims, 2 Drawing Sheets

HETEROSTRUCTURE DEVICE USEABLE AS A FAR INFRARED PHOTODETECTOR

The invention pertains generally to photodetectors of light in the far infrared, having wavelengths on the order of centimeter to submillimeter, and pertains more specifically to semiconductor heterostructures used for this.

BACKGROUND OF THE INVENTION

Doped semiconductors have for some time been used as photodetectors. Incident photons of light supply the energy to raise charge carriers (electrons or holes) of doping impurities from the ground state to a conducting state, resulting in a detectable electric current the magnitude of which indicates the intensity of light. There currently exists great interest in developing photodetectors, most especially semiconductor photodetectors, effective for the far infrared and millimeter wave regions of the electromagnetic spectrum. In the past, heterostructures have been used for this purpose, an example of which is given in Statutory Inventorship Registration No. H95 to Shanabrook et al., the disclosure of which incorporated herein by reference. The Shananbrook et al. document discloses a heterostructure in which charge carriers migrate, as in any heterostructure, from barrier to adjacent well layers, where the carriers become weakly bound to doping impurities in the well layers. These weak bonds, allow light photons of corresponding low energies to raise these charge carriers to the conduction band, where they contribute to detection of current. Unfortunately, even though these weak binding energies permit detection of very low light frequencies, the frequency range does not extend far enough to meet current needs. Moreover, permitted quantum states in such devices are determined by the dimensions of such devices, which are set at the time of device fabrication, and thus the frequencies of light for which these devices detect, are also set at fabrication. Permitting the tuning of such devices to desired light frequencies would be most welcome in the art.

SUMMARY OF THE INVENTION

Accordingly, an object of the invention is to extend the frequency range which semiconductor photodetectors are useful further into the infrared, most especially down to the submillimeter wave range.

Another object of the invention is to permit the frequencies that such devices detect to be made continuously variable.

In accordance with these and other objects made apparent hereinafter, one feature of the invention is a heterostructure having at least two barrier layers doped with impurities that provide charge carriers, and at least one well layer disposed between the two barrier layers. The width of the barrier layers and well layers are chosen so that the mean distance from the impurities in the barrier layers to the charge carriers in the well layer causes them to be weakly Coulomb bound together a sufficient amount to lower the charge carriers in the well below the well's conduction band to a quantum state characterized by quantum number $m=0$. This weak bonding energy is all that a photon must overcome to raise an electron to the well's conduction band, which greatly lowers the frequency of light detectable by such devices.

In accordance with another feature of the invention, a heterostructure of this kind is combined with a generator of a magnetic or electric field. This tends to spread apart quantum states in the well, thus shifting the resonant absorption frequency, and permitting fine tuning of the absorption energy.

The invention is more fully understood from the following detailed description of a preferred embodiment, it being understood, however, that the invention is capable of extended application beyond the precise details of the preferred embodiment. Changes in modifications can be made that do not affect the spirit of the invention, nor exceeded its scope, as expressed in the appended claims. Accordingly, the invention is described with particular reference to the accompanying drawings, wherein:

DETAILED DESCRIPTION

Figure 1A:
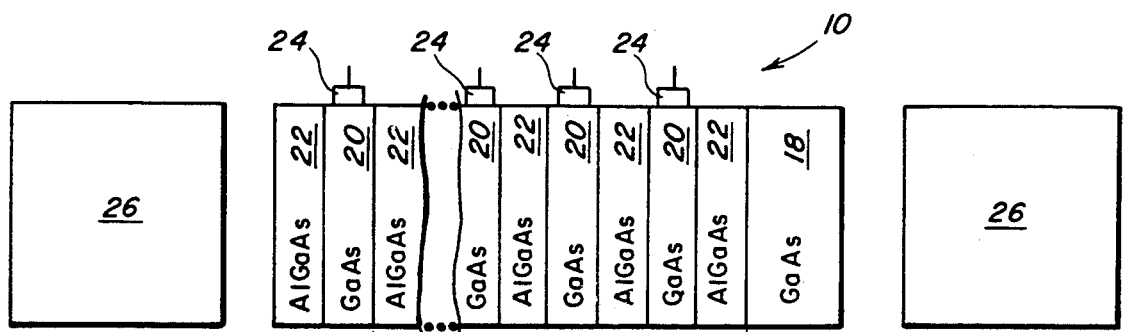
FIG. 1a is a schematic diagram of a heterostructure in accordance with the invention.
Figure 1B:
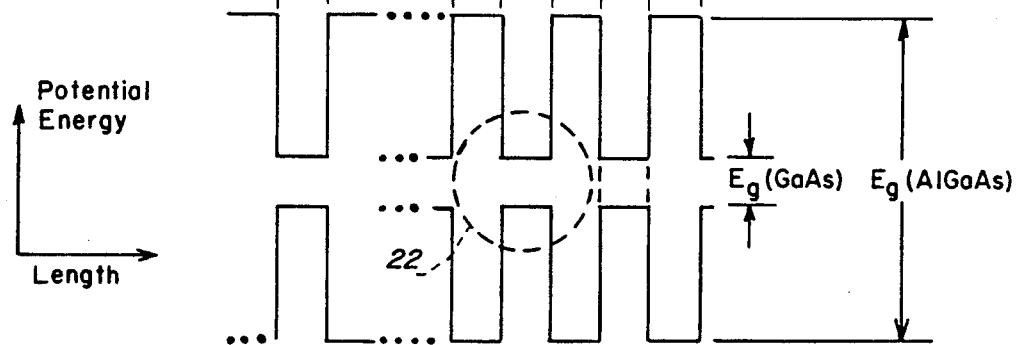
FIG. 1b is an energy level diagram showing the bandgap energies of the various layers within the heterostructure.
Figure 2:
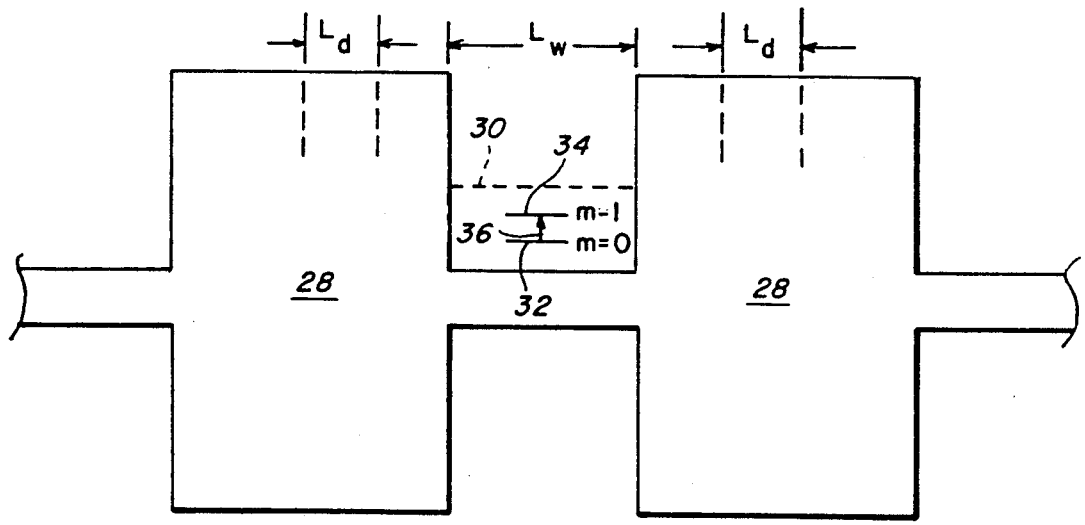
FIG. 2 is a detail of the portion of FIG. 1b encircled by dotted lines 2—2.

With particular reference to the drawing figures, in which like reference numerals indicate like structure throughout the several views, FIG. 1a shows a heterostructure 10 having epitaxial layers 20, 22 grown sequentially on one another, and ultimately from a semiconductor substrate 18. Alternating layers 20, 22 of heterostructure 10 are of alternatingly high and low bandgap materials, preferably aluminum gallium arsenide (AlGaAs) and gallium arsenide (GaAs), semiconductor materials which are currently of great interest to industry and research. Substrate 18 is of gallium arsenide. Layers 22 are doped with electron donor impurities, preferably silicon, in a region indicated by $L_d$ (FIG. 2). Although the preferred embodiment uses gallium arsenide and silicon doped (i.e. n-doped) aluminum gallium arsenide, this is for purposes of illustration, not limitation. The principles underlying the invention pertain to any type-1 superlattice heterostructure, and to any type-2 superlattice in which the valence and conduction bands edges are separated in energy throughout the lattice sufficiently to prevent ready communication between the bands. A non-exhaustive list of materials which can be built into heterostructures of applicants' kind are: zinc manganese telluride and zinc telluride, indium gallium arsenide and gallium arsenide, and silicon-germanium and silicon. FIG. 1b shows graphically the potential energy within the layers 22, 24 of heterostructure 10. As seen in FIG. 1b, the bandgap energy (illustrated as $E_g$) of aluminum gallium arsenide layers 22 is much greater than that of gallium arsenide layers 20. Electrons of the donor impurities in an aluminum states, and migrate to the conduction bands of adjacent layers 20, where, because of the much higher conduction band energies of the surrounding layers 22, they tend to be trapped. For this reason, layers 20 are referred to as "energy wells" or "energy well layers," and layers 22 as "barrier layers." A quantum well is constituted by at least one such well layer being disposed between at least two such barrier layers; in practice, because of the small size of such devices one must use a plurality of wells together (as is illustrated in FIG. 1) to generate adequate current output. This migration of electrons from layers 22 to layers 20 also leaves in layers 22 corresponding positive charges at the sites of the donor impurities.

Under normal circumstances, the electrons transferred to the conduction band of energy wells 20 would distribute themselves in the lowest energy state permitted in the well, this energy being determined by the length $L_w$ of the well in a manner well known to those skilled in the art or otherwise knowledgable of quantum mechanic's. However, applicants have determined that if the residual charge in barrier layers 22 is physically close enough to the electrons that have migrated to the well layers 20, these electrons remain weakly bound by Coulomb force to the donor atoms in layers 22, occupying a quantum state corresponding to quantum number $m=0$ just below the well layers' conduction band edge, the binding energy of this state being, of course, the Coulomb binding energy between donor atom located in layer 22 and its distant electron located in layer 20. This is illustrated in FIG. 2, in which dotted line 30 indicates the ground state of well 22. Lines 32 and 34 indicate the quantum states of the donor atoms corresponding to quantum numbers $m=0$ and $m=1$ respectively, and 36 indicates the gap energy between these two energy states.

Because of bandgap 36, well layers 20 have an absorptive resonant peak for photons at the energy corresponding to gap 36. Energy level 34 is so close to conduction bandedge 30 that stray phonon energy will readily lift electrons from quantum state 34 to conduction band 30, where the electron can be swept out through appropriately biased ohmic contacts 24 and contribute to detectable photocurrent. In this manner heterostructure 10 measures light incident on well layers 20. Because these electrons are physically distant from the donor atoms to which they are bound, the energy of transition between the $m=0$ and $m=1$ states is extremely small, permitting detectors of this kind to selectively detect light of much lower energy (longer wavelength) than previous detectors.

The magnitude of gap energy 36 depends in part on the barrier length $L_b$, well width $L_w$, and the distribution of donor atoms in barrier layers 22. In general, each of these dimensions affects the mean distance between donor atoms in barriers 22 and their electrons in wells 20. This in turn affects the Coulomb force between the impurity atoms and their electrons. For decreased Coulomb force, quantum levels 32, 34 move together, decreasing bandgap 36. This shifts the absorption resonance lower in energy, and thus permits one to design a heterostructure of this type tuned narrowly to any photon energy down to virtually zero energy. One skilled in this art can readily apply the principles of quantum mechanics to choose the correct values of these design parameters for any given application once instructed in the purpose of so doing by this disclosure.

The lengths of layers $L_b$ and $L_w$ have no theoretical limits. The preferred range for barrierlength $L_b$ is less than or equal to about 500 Å. Above this distance, donor impurity atoms and their valence electrons are separated so far that Coulomb forces become negligible. The preferred range for well width $L_w$ is between 100 Å and 500 Å for the same reason, and because present technology has difficulty attaching reliable ohmic contacts to semiconductors of smaller length. Doping in the barriers ($N_b$) in general affects device operation only in that higher doping provides more electrons to absorb photons, and thus increases device sensitivity, and in that at doping levels high enough to cause overlap of the donors' Bohr radii degrade device performance. In the preferred embodiment this is avoided by maintaining the doping level at or below $4(10)^{16} cm^{-3}$.

Figure 4:
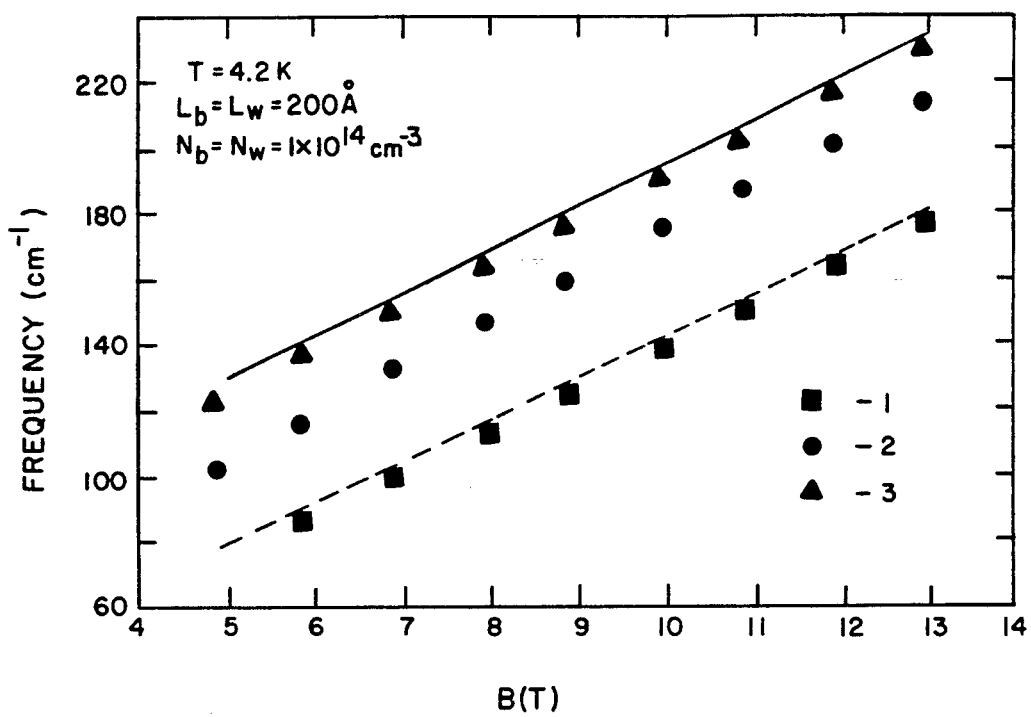
FIG. 4 is a graph illustrating the relationship between the frequency of light absorbed and the magnetic flux intensity.
Figure 3:
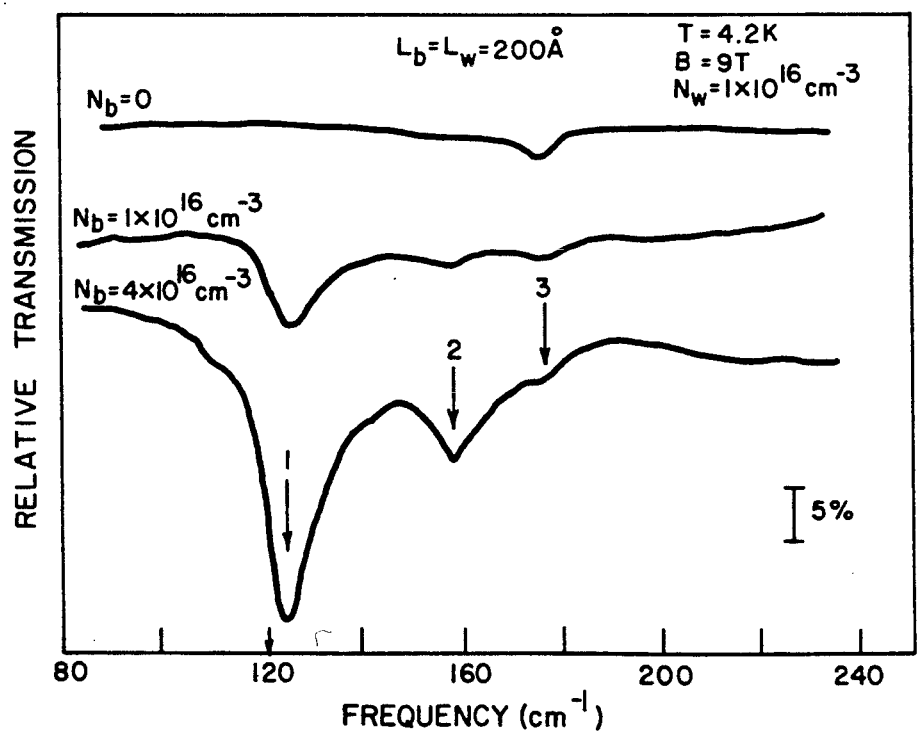
FIG. 3 is a graph showing relative light transmission as a function of light frequency for the preferred embodiment.

FIGS. 3 and 4 show data taken on a heterostructure of the kind described above. The barrier layers, about fifty in the device tested, were of $Al_{0.3}Ga_{0.7}As$, and the barrier doping $N_b$ and layer widths $L_b$ and $L_w$ are given on the figure. (The only limit on the value of x is that it be sufficiently high to form an effective barrier, and experience shows that values of x greater than or equal to 0.1 will do adequately.) The data were taken at 4.2° K. to prevent thermal background energy from disturbing the quantum transitions of interest. (Indeed, all detectors in the vicinity of infrared must be cooled in this manner for the same reason.) Absorption peak number one, at about 120 $cm^{-1}$ (about $3.6(10)^{10}hz$ or about $8(10)^{-2}mm$ wavelength) corresponds to transitions from the $m=0$ to $m=1$ states as above described. As indicated on FIG. 3, there data were taken while the heterostructure was exposed to a magnetic flux intensity of 9 Tesla. Generally, application of a magnetic or electric field spreads pertinent quantum levels apart in energy, and shifts resonant absorption by the $m=0$ to $m=1$ transition to higher energy (shorter wavelength). This effect is shown for a magnetic field by the data in FIG. 4. This shifting under an applied field of the frequency at which the heterostructure is most sensitive permits one to tune the device by imposing and selectively varying a static electric or magnetic field to heterostructure 10 along its length. For this reason, conventional generator 26 is employed to impose an electric or magnetic field across heterostructure 10 (FIG. 1).

The invention has been described in what has considered to be the most practical and preferred embodiment. It is recognized however, that obvious modifications may occur to those with skill in this art. According, the scope of the invention is to be discerned solely by reference by the appended claims, wherein:

What is claimed and desired to be secured by Letters Patent of the United States is:

1. A heterostructure comprising:
   at least two barrier layers doped with doping impurities that provide charge carriers;
   at least one well layer disposed between said at least two barrier layers;
   wherein the width of said at least two barrier layers, the width of said well layer, and the mean distance of said doping impurities from said at least one well layer, are effective to permit charge carriers in said at least one well layer to be Coulomb bound to said doping impurities a sufficient amount to lower said charge carriers in energy below the conduction band of said well to the impurity substate having quantum number $m=0$.

2. The heterostructure of claim 1, wherein said barrier layer is $Al_xGa_{1-x}As$, x being between 0.1 and 1, wherein said doping impurities is silicon doping to a concentration less than or equal to about $4(10)^{16}cm^{-3}$.

3. The heterostructure of claim 2, wherein a length of said at least two barrier layers and said at least one well layer is each about 200 Å.

4. A detector system comprising:

at least two barrier layers doped with doping impurities that provide charge carriers;

at least one well layer disposed between said at least two barrier layers;

wherein the width of said at least two barrier layers, the width of said well layer, and the mean distance of said doping impurities from said at least one well layer, are effective to permit charge carriers in said at least one well layer to be Coulomb bound to said doping impurities a sufficient amount to lower said charge carriers in energy below the conduction band of said well to the impurity substate having quantum number $m=0$;

means for selectively varying the energy gap between said $m=0$ and the $m=1$ impurity sub-states said means for selectively varying comprising one of the set whose members are: means for applying an electric field to said at least one well layer, and means for applying a magnetic field to said at least one well layer.

5. The system of claim 4, wherein said barrier layer is $Al_xGa_{1-x}As$, x being between 0.1 and 1, wherein said doping impurities is silicon doping to a concentration less than or equal to about $4(10)^{16}cm^{-3}$.

6. The system of claim 5, wherein a length of said at least two barrier layers and said at least one well layer is each about 200 Å.

7. A heterostructure comprising:
at least two barrier layers of $Al_xGa_{1-x}As$;
at least one well layer of GaAs disposed between, and epitaxial with, said at least two barrier layers;
the width of each of said at least two barrier layers being between 100 Å and 500 Å;
x being between about 0.1 and 1.0;
each of said at least two barrier layers being doped with silicon to a dopant concentration of less than or equal to about $4(10)^{16}cm^{-3}$; and
the width of said at least one well layer being less than about 500 Å.

8. The heterostructure of claim 2, wherein, said x is about 0.3.

9. The heterostructure of claim 5, wherein said x is about 0.3.

10. The heterostructure of claim 7, wherein said x is about 0.3.

* * * * *